US012652937B2

(12) United States Patent
Yang et al.

(10) Patent No.: US 12,652,937 B2
(45) Date of Patent: Jun. 9, 2026

(54) ORGANIC LIGHT EMITTING DISPLAY DEVICE

(71) Applicant: LG Display Co., Ltd., Seoul (KR)

(72) Inventors: Ji-Seok Yang, Paju-si (KR); Dong-Ryul Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 599 days.

(21) Appl. No.: 18/051,029

(22) Filed: Oct. 31, 2022

(65) Prior Publication Data

US 2023/0180568 A1     Jun. 8, 2023

(30) Foreign Application Priority Data

Dec. 6, 2021     (KR) ......................... 10-2021-0173221

(51) Int. Cl.
*H10K 59/80*     (2023.01)
*H10K 59/35*     (2023.01)
*H10K 59/38*     (2023.01)

(52) U.S. Cl.
CPC ......... *H10K 59/879* (2023.02); *H10K 59/351* (2023.02); *H10K 59/353* (2023.02); *H10K 59/38* (2023.02)

(58) Field of Classification Search
None
See application file for complete search history.

(56) References Cited

U.S. PATENT DOCUMENTS

| | | | | | |
|---|---|---|---|---|---|
| 2009/0294815 | A1* | 12/2009 | Ohtsuki | ................ | H10F 39/802 |
| | | | | | 257/E31.127 |
| 2015/0084026 | A1* | 3/2015 | Miyamoto | ........... | H10K 59/879 |
| | | | | | 257/40 |
| 2015/0103338 | A1* | 4/2015 | Kim | ..................... | G02B 5/0278 |
| | | | | | 257/40 |
| 2016/0064694 | A1* | 3/2016 | Choi | ..................... | H10K 59/38 |
| | | | | | 257/40 |
| 2016/0079311 | A1* | 3/2016 | Lim | .................. | H10K 59/8792 |
| | | | | | 257/40 |

(Continued)

FOREIGN PATENT DOCUMENTS

| | | |
|---|---|---|
| CN | 111863875 A | 10/2020 |
| KR | 20090126597 A | 12/2009 |

(Continued)

OTHER PUBLICATIONS

Office Action in Korean Appln. No. 10-2021-0173221, mailed on Jul. 14, 2025, 9 pages (with English translation).

(Continued)

*Primary Examiner* — Bilkis Jahan

(74) *Attorney, Agent, or Firm* — Fish & Richardson P.C.

(57) ABSTRACT

An organic light emitting display device includes a substrate in which a pixel is defined, the pixel including a white sub-pixel which includes an emission area and a non-emission area; a first light emitting diode located in the white sub-pixel; and a light extraction layer located on an outer surface of the substrate corresponding to a transmission direction of a light emitted from the first light emitting diode, wherein the light extraction layer includes a first lens corresponding to the emission area and a second lens corresponding to the non-emission area, wherein a height of the first lens is greater than a height of the second lens.

18 Claims, 5 Drawing Sheets

(56)         References Cited

U.S. PATENT DOCUMENTS

2016/0334074 A1 *  11/2016  Fukui ................ G02B 19/0061
2017/0084875 A1 *   3/2017  Joung .................... H10K 50/85

FOREIGN PATENT DOCUMENTS

| KR | 20100022296 | A | 3/2010 |
| KR | 10-2011-0056012 | A | 5/2011 |
| KR | 10-2016-0039443 | A | 4/2016 |
| KR | 20180131714 | A | 12/2018 |

OTHER PUBLICATIONS

Office Action in Chinese Appln. No. 2022113490643, mailed on
Dec. 30, 2025, 11 pages (with English translation).

* cited by examiner

ORGANIC LIGHT EMITTING DISPLAY DEVICE

CROSS REFERENCE TO RELATED APPLICATION

The present application claims the priority of Korean Patent Application No. 10-2021-0173221 filed on Dec. 6, 2021, which is hereby incorporated by reference in its entirety for all purposes as if fully set forth herein.

BACKGROUND

Field of the Disclosure

The present disclosure relates to an organic light emitting display device capable of realizing a high luminance.

Description of the Background

Recently, as society enters a full-fledged information age, interest in information displays that process and display a large amount of information has been increased, and as a demand for using portable information media has been increased, various lightweight and thin flat displays have been developed and been in the spotlight.

In particular, among various flat display devices, an organic light emitting display device (OLED) is a self-luminous device and does not require a backlight used in a liquid crystal display device (LCD) which is non self-luminous device, and thus can be lightweight and thin.

In addition, compared to the liquid crystal display device, the organic light emitting display device has excellent viewing angle and contrast ratio, is advantageous in power consumption, enables a DC low voltage driving, has a fast response speed, is strong against an external shock because of their internal components being solid, and has a wide operating temperature range.

The organic light emitting display device may further include a white sub-pixel emitting a white light in addition to a red sub-pixel emitting a red light, a green sub-pixel emitting a green light and a blue sub-pixel emitting a blue light to realize a high luminance.

In this case, the white sub-pixel has the greatest influence on realization of a high luminance.

SUMMARY

Accordingly, the present disclosure is directed to an organic light emitting display device that substantially obviates one or more of the problems due to limitations and disadvantages of the related art.

An advantage of the present disclosure is to provide an organic light emitting display device which can maximize a luminance increase due to a white sub-pixel.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, an organic light emitting display device includes a substrate in which a pixel is defined, the pixel including a white sub-pixel which includes an emission area and a non-emission area; a first light emitting diode located in the white sub-pixel; and a light extraction layer located on an outer surface of the substrate corresponding to a transmission direction of a light emitted from the first light emitting diode, wherein the light extraction layer includes a first lens corresponding to the emission area and a second lens corresponding to the non-emission area, wherein a height of the first lens is greater than a height of the second lens.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principles of the disclosure.

In the drawings.

DETAILED DESCRIPTION OF THE ILLUSTRATED ASPECTS

Hereinafter, an aspect according to the present disclosure is described with reference to the drawings.

Figure 1A:
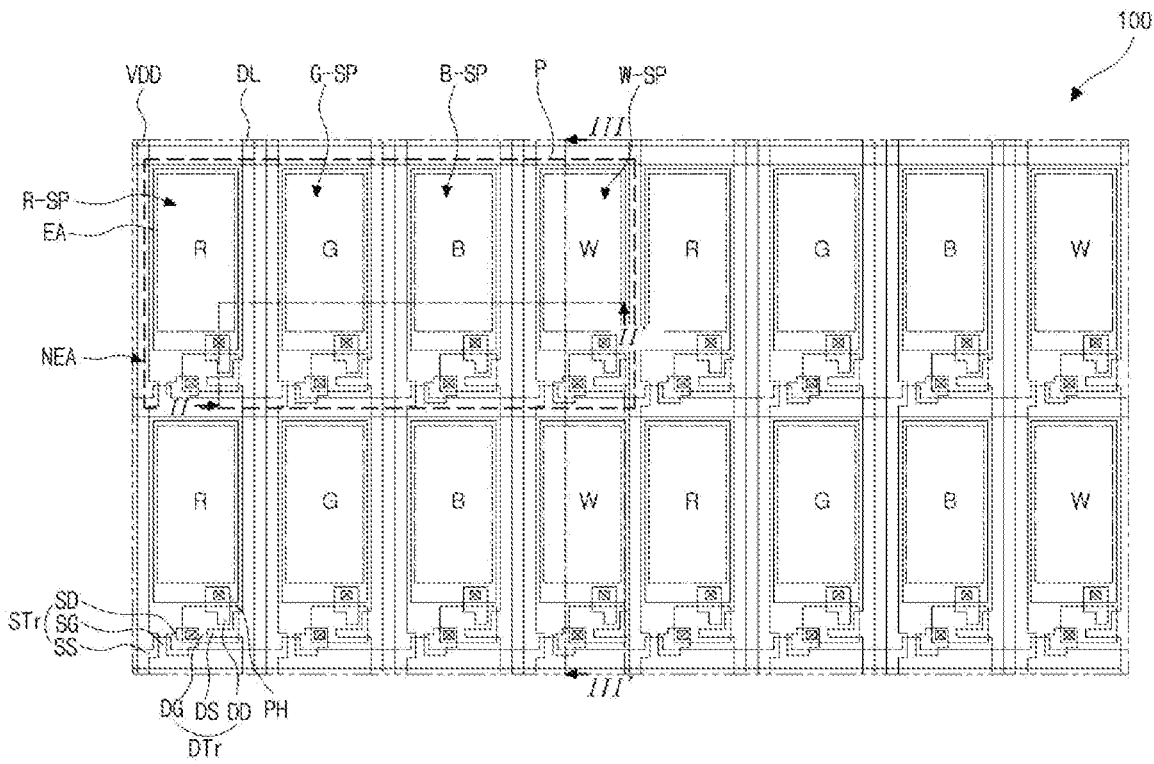
FIG. 1A is a plan view illustrating a plurality of sub-pixels in an organic light emitting display device according to a first aspect of the present disclosure.
Figure 1B:
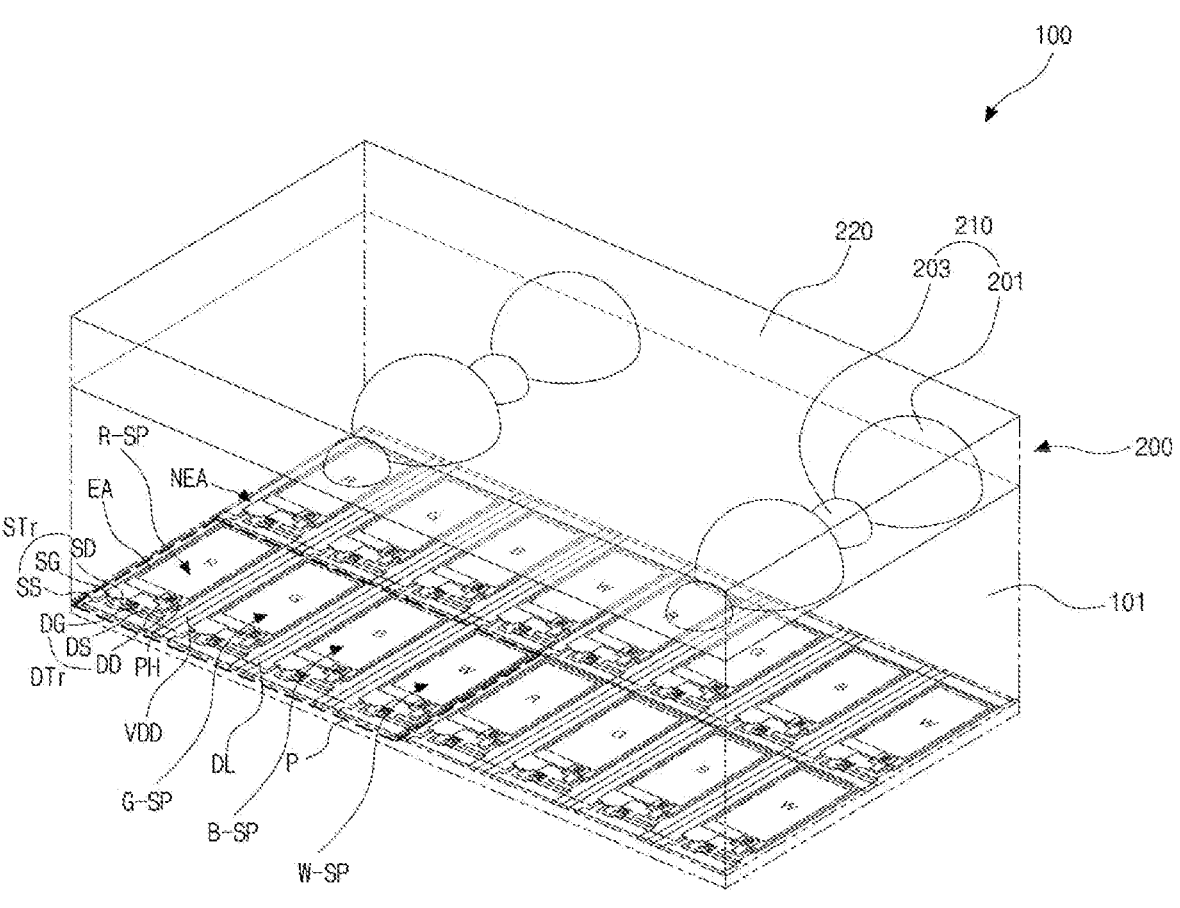
FIG. 1B is a perspective view schematically illustrating a back surface of FIG. 1A.

FIG. 1A is a plan view illustrating a plurality of sub-pixels in an organic light emitting display device according to a first aspect of the present disclosure, and FIG. 1B is a perspective view schematically illustrating a back surface of FIG. 1A.

As shown in FIGS. 1A and 1B, in the organic light emitting display device 100 according to the first aspect of the present disclosure, one unit pixel P may include red, green and blue sub-pixels R-SP, G-SP and B-SP. Each of the sub-pixels R-SP, G-SP and B-SP may include an emission area EA, and a bank (119 of FIG. 2) may be disposed along an edge of the emission area EA to form a non-emission area NEA.

In this case, the red, green and blue sub-pixels R-SP, G-SP and B-SP may be alternately disposed in a horizontal direction, and each of a plurality of red, green and blue sub-pixels R-SP, G-SP and B-SP may be arranged in a vertical direction.

Accordingly, each of the red, green and blue sub-pixels R-SP, G-SP and B-SP may have a structure arranged in a stripe shape.

In addition, one unit pixel P may further include a white sub-pixel W-SP, and one unit pixel P including the red, green, blue and white sub-pixels R-SP, G-SP, B-SP and W-SP may have a rectangular structure.

Here, for convenience of explanations, the sub-pixels R-SP, G-SP, B-SP and W-SP is illustrated as being positioned side by side with the same width, but the sub-pixels R-SP, G-SP, B-SP and W-SP may have various structures with different widths.

At this time, switching and driving thin film transistors STr and DTr may be provided on the non-emission area NEA of each of the sub-pixels R-SP, G-SP, B-SP and W-SP. A light emitting diode (E of FIG. 2) including a first electrode (111 of FIG. 2), an organic light emitting layer (113a, 113b, 113c or 113d of FIG. 2) and a second electrode (115 of FIG. 2) may be disposed on the emission area EA of each of the sub-pixels R-SP, G-SP, B-SP and W-SP.

Figure 2:
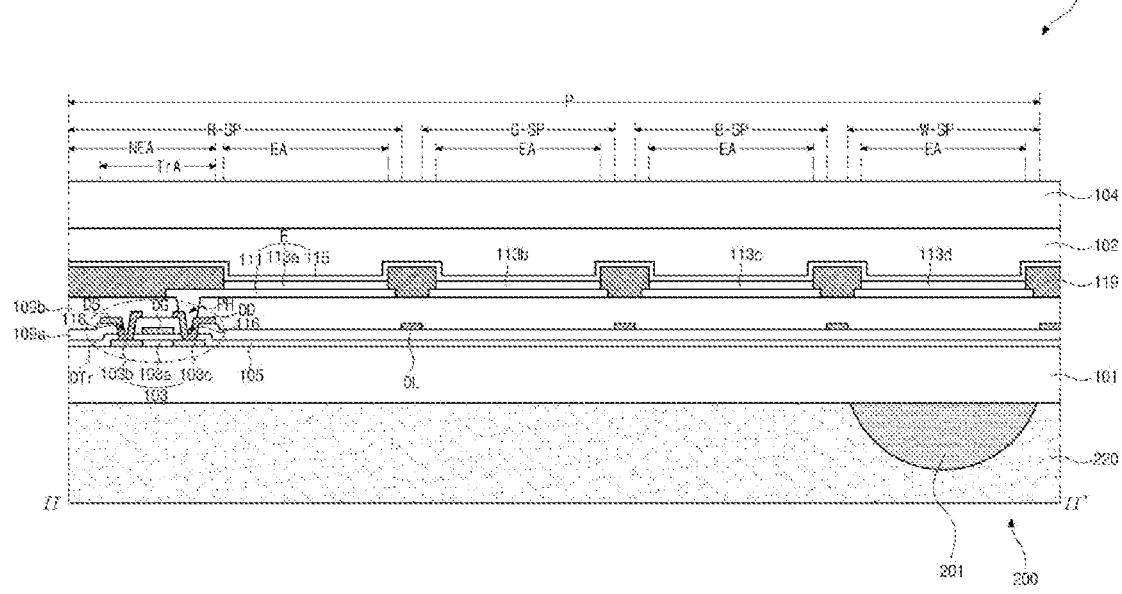
FIG. 2 is a cross-sectional view, taken along line II-II' of FIG. 1A, illustrating a structure of a unit pixel including four sub-pixels of an organic light emitting display device according to a first aspect of the present disclosure.

Here, the switching thin film transistor STr and the driving thin film transistor DTr may be connected to each other, and the driving thin film transistor DTr may be connected to the light emitting diode (E of FIG. 2).

In more detail, a gate line GL, a data line DL and a power line VDD may be disposed on the substrate 101 to define each of the sub-pixels R-SP, G-SP, B-SP and W-SP.

The switching thin film transistor STr may be formed in a region where the gate line GL and the data line DL cross each other, and the switching thin film transistor STr may serve to elect each of the sub-pixels R-SP, G-SP, B-SP and W-SP.

The switching thin film transistor STr may include a gate electrode SG branching from the gate line GL, a semiconductor layer (not shown), a source electrode SS, and a drain electrode SD.

The driving thin film transistor DTr may serve to drive the light emitting diode (E of FIG. 2) of each of the sub-pixels R-SP, G-SP, B-SP and W-SP selected by the switching thin film transistor STr. The driving thin film transistor DTr may include a gate electrode DG connected to the drain electrode SD of the switching thin film transistor STr, a semiconductor layer (103 of FIG. 2), a source electrode DS connected to the power line VDD, and a drain electrode DD.

The drain electrode DD of the driving thin film transistor DTr may be connected to the first electrode (111 of FIG. 2) of the light emitting diode (E of FIG. 2).

The organic light emitting layer (113a, 113b, 113c or 113d of FIG. 2) may be interposed between the first electrode (111 of FIG. 2) and the second electrode (115 of FIG. 2) of the light emitting diode (E, see FIG. 2).

Here, the organic light emitting display device 100 according to the first aspect of the present disclosure may be a bottom emission type display device, and it is characterized in that a light extraction layer (or light out-coupling layer) 200 including first and second lenses 201 and 203 is positioned on a back surface (or rear surface) of the substrate 101 corresponding to the white sub-pixel W-SP.

The first lens 201 of the light extraction layer 200 may be positioned to correspond to the emission area EA of the white sub-pixel W-SP, and the second lens 203 of the light extraction layer 200 may be positioned to correspond to the non-emission area NEA of the white sub-pixel W-SP. A high refractive index layer 220 may be positioned on and cover the first and second lenses 201 and 203.

The light extraction layer 200 improves an out-coupling efficiency (or extraction efficiency) by refracting a light trapped inside the substrate 101 out of a light emitted from the white sub-pixel W-SP to an outside of the substrate 101.

Accordingly, the organic light emitting display device 100 according to the first aspect of the present disclosure can realize a high luminance.

This is described in more detail with reference to FIGS. 2 and 3.

Figure 3:
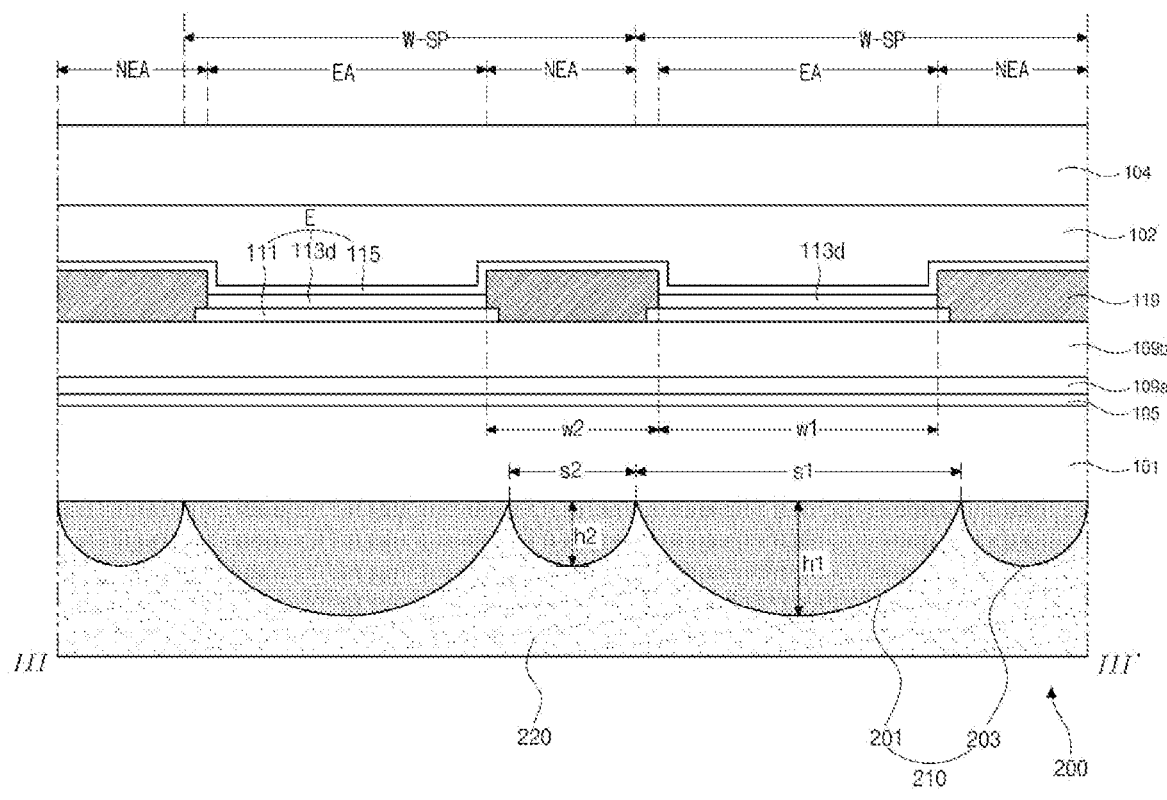
FIG. 3 is a cross-sectional view taken along line III-III' of FIG. 1A.

FIG. 2 is a cross-sectional view, taken along line II-II' of FIG. 1A, illustrating a structure of a unit pixel including four sub-pixels of an organic light emitting display device according to the first aspect of the present disclosure, and FIG. 3 is a cross-sectional view taken along line III-III' of FIG. 1A.

Figure 4:
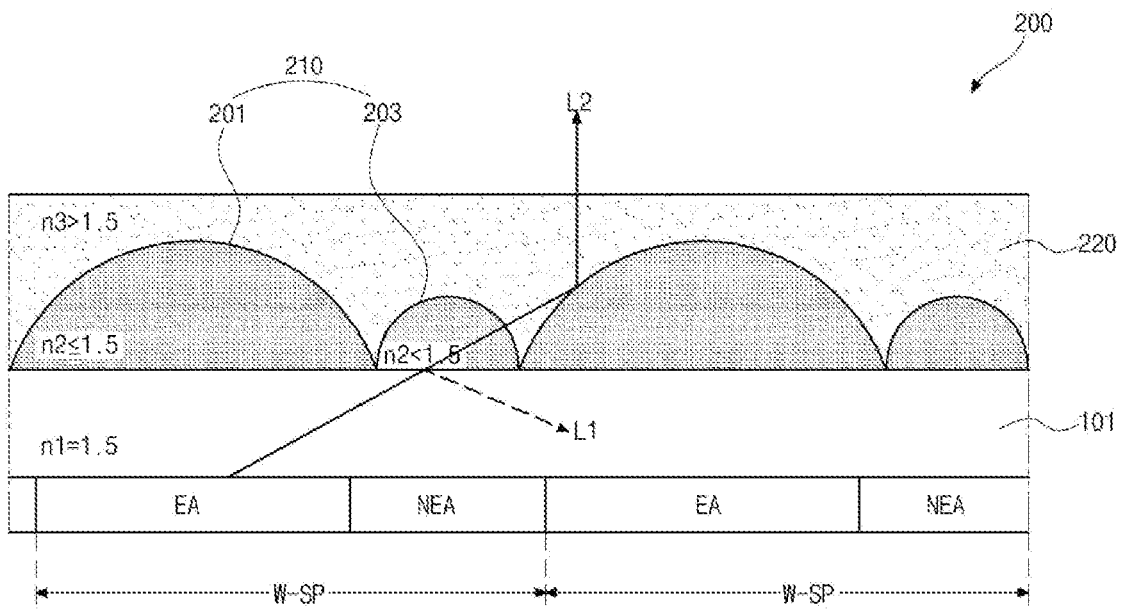
FIG. 4 is a schematic view schematically illustrating a light path of an organic light emitting display device according to a first aspect of the present disclosure.

FIG. 4 is a schematic view schematically illustrating a light path of an organic light emitting display device according to the first aspect of the present disclosure.

As shown in FIGS. 2 and 3, one unit pixel P may include red, green, blue, and white sub-pixels R-SP, G-SP, B-SP, and W-SP. Each of the sub-pixels R-SP, G-SP, B-SP, and W-SP may include the emission area EA, and the bank 119 may be disposed along the edge of the emission area EA to form the non-emission area NEA.

At this time, the semiconductor layer 103 may be located on a switching area TrA of the non-emission area NEA of each of the sub-pixels R-SP, G-SP, B-SP and W-SP on the substrate 101. The semiconductor layer 103 may be made of silicon, and may include an active region 103a forming a channel at a center portion thereof, and source and drain regions 103b and 103c doped with a high concentration of impurities at both sides of the active region 103a.

A gate insulating layer 105 may be positioned on the semiconductor layer 103.

The gate electrode DG corresponding to the active region 103a of the semiconductor layer 103 and the gate line GL extending in one direction may be provided on the gate insulating layer 105.

In addition, a first inter-layered insulating layer 109a may be positioned on the gate electrode DG and the gate line GL. In this case, the first inter-layered insulating layer 109a and the gate insulating layer 105 therebelow may include first and second semiconductor layer contact holes 116 respectively exposing the source and drain regions 103b and 103c located at both sides of the active region 103a.

In addition, on the first inter-layered insulating layer 109a including the first and second semiconductor layer contact holes 116, the source and drain electrodes DS and DD respectively contacting the source and drain regions 103b and 103c through the first and second semiconductor layer contact holes 116 may be provided.

A second inter-layered insulating layer 109b may be positioned on the source and drain electrodes DS and DD and the first inter-layered insulating layer 109a exposed between the two electrodes DS and DD.

In this case, the source and drain electrodes DS and DD, the semiconductor layer 103 including the source and drain regions 103b and 103c contacting the source and drain electrodes DS and DD, and the gate insulating layer 105 and the gate electrode DG positioned on the semiconductor layer 103 form the driving thin film transistor DTr.

Meanwhile, the switching thin film transistor (STr of FIG. 1B) may have the same structure as the driving thin film transistor DTr and may be connected to the driving thin film transistor DTr.

In addition, in the drawing, the driving thin film transistor DTr as a top gate type transistor in which the semiconductor layer 103 is made of a polysilicon semiconductor layer or an oxide semiconductor layer is shown as an example, and as a modification thereof, the driving thin film transistor (DTr) may be a bottom gate type transistor formed of pure and impurity amorphous silicon.

In this case, when the semiconductor layer 103 is made of an oxide semiconductor layer, a light blocking layer (not shown) may be further positioned below the semiconductor layer 103, and a buffer layer (not shown) may be disposed between the light blocking layer (not shown) and the semiconductor layer 103.

The second inter-layered insulating layer 109b may include a drain contact hole PH exposing the drain electrode DD of the driving thin film transistor DTr. The first electrode 111 as an anode of the light emitting diode E may be positioned on the second inter-layered insulating layer 109b, may be connected to the drain electrode DD of the driving thin film transistor DTr through the drain contact hole PH, and may be made of, for example, a material having a relatively high work function value.

The first electrode 111 may be positioned for each of the sub-pixels R-SP, G-SP, B-SP and W-SP. The bank 119 may be positioned between the first electrodes 111 of each of the sub-pixels R-SP, G-SP, B-SP and W-SP. In other words, the first electrode 111 may have a separate structure for each of the sub-pixels R-SP, G-SP, B-SP and W-SP with the bank 119 as a boundary for each of the sub-pixels R-SP, G-SP, B-SP and W-SP.

In addition, the organic light emitting layers 113a, 113b, 113c and 113d may be positioned on the first electrodes 111. Each of the organic light-emitting layers 113a, 113b, 113c and 113d may be configured with a single layer made of an emitting material. Alternatively, each of the organic light-emitting layers 113a, 113b, 113c and 113d may be configured with multiple layers of a hole injection layer, a hole transport layer, an emitting material layer, an electron transport layer and an electron injection layer to increase an emission efficiency.

Here, the organic light emitting display device 100 according to the first aspect of the present disclosure may have the organic light emitting layers 113a, 113b, 113c and 113d that emit different colors for the sub-pixels R-SP, G-SP, B-SP and W-SP.

In other words, the organic light-emitting layer 113a emitting a red light may be positioned on the entire emission area EA of the red sub-pixel R-SP, the organic light emitting layer 113b emitting a green light may be positioned on the entire emission area EA of the green sub-pixel G-SP, and the organic light emitting layer 113c emitting a blue light may be positioned on the entire emission area EA of the blue sub-pixel B-SP.

In addition, the organic light emitting layer 113d emitting a white light may be positioned on the entire emission area EA of the white sub-pixel W-SP.

Accordingly, in the organic light emitting display device 100 according to the first aspect of the present disclosure, R, G, B and W colors may be emitted for the respective sub-pixels R-SP, G-SP, B-SP and W-SP, and thus a full color of high brightness may be realized.

Alternatively, although not shown, the same white light may be emitted from the organic light emitting layers 113a, 113b, 113c and 113d of the respective sub-pixels R-SP, G-SP, B-SP and W-SP, and a color conversion layer may be further positioned to correspond to each of the sub-pixels R-SP, G-SP, B-SP and W-SP.

The color conversion layer may be formed of a color filter pattern, which is for converting a color of the white light emitted from each of the organic light emitting layers 113a, 113b, 113c and 113d. A red color filter pattern, a green color filter pattern, a blue color filter pattern and a white color filter pattern may be positioned to correspond to the emission areas EA of the respective sub-pixels R-SP, G-SP, B-SP and W-SP.

In this case, without the white color filter pattern disposed on the emission area EA of the white sub-pixel W-SP, the white light emitted from the organic light emitting layer 113d may be transmitted as it is.

The second electrode 115 forming a cathode may be positioned on the entire surface of the organic light emitting layers 113a, 113b, 113c and 113d.

The second electrode 115 may be made of a metal material having a relatively low work function value to serve as a cathode.

In the organic light emitting display device 100, when predetermined voltages are applied to the first electrode 111 and the second electrode 115 according to the selected signal, holes injected from the first electrode 111 and electrons provided from the second electrode 115 are transported to each of the organic light emitting layers 113a, 113b, 113c and 113d to form excitons, and when the excitons are transitioned from an excited state to a ground state, a light is generated and emitted in a form of visible light.

Here, the organic light emitting display device 100 according to the first aspect of the present disclosure is a bottom emission type display device, a light emitted from each of the organic light emitting layers 113a, 113b, 113c and 113d passes through the first electrode 111 and is output to the outside, and accordingly, the organic light emitting display device 100 finally realizes an arbitrary image.

In this case, the second electrode 115 as the cathode may be formed of a metal material of a high reflectance such as aluminum (Al) and a stacked structure of aluminum (Al) and indium tin oxide (ITO). The first electrode 111 as the anode may be formed of a transparent metal material such as ITO or indium zinc oxide (IZO) or a semi-transparent metal material such as magnesium (Mg) or silver (Ag) so that each of a red light, a green light, a blue light and a white light emitted from the respective organic light emitting layers 113a, 113b, 113c and 113d may be transmitted.

A passivation layer 102 in a form of a thin film and an encapsulation substrate 104 may be sequentially positioned on the thin film transistors (STr and DTr of FIG. 1B) and the light emitting diode E. The passivation layer 102 may serve to prevent a penetration of moisture into each of the sub-pixels R-SP, G-SP, B-SP and W-SP and to protect the organic light emitting layers 113a, 113b, 113c and 113d which are vulnerable to an external moisture or oxygen.

In addition, the passivation layer 102 may serve to protect the thin film transistors (STr and DTr of FIG. 1B) and the light emitting diode E from an external impact, and the passivation layer 102 may serve to bond the substrate 101 and the encapsulation substrate 104.

Accordingly, the organic light emitting display device 100 is encapsulated.

It is characterized in that the organic light emitting display device 100 according to the first aspect of the present disclosure may further include the light extraction layer 200 outside the substrate 101 through which lights emitted from the organic light emitting layers 113a, 113b, 113c and 113d is finally transmitted.

The light extraction layer 200 may include the lens layer 210 and the high refractive index layer 220 covering the lens layer 210. The lens layer 210 may include the first lens 201 positioned to correspond to the emission area EA of the white sub-pixel W-SP and the second lens 203 positioned to correspond to the non-emission area NEA of the white sub-pixel W-SP.

Here, the non-emission area NEA of the white sub-pixel W-SP may be an area in which the switching and driving thin film transistors (STr and DTr of FIG. 1B) are located, and when the white sub-pixels W-SP are disposed in the vertical direction, the non-emission area NEA may correspond to an area between neighboring white sub-pixels W-SP.

Both the first and second lenses 201 and 203 may serve to refract light emitted from the organic light emitting layer 113d of the white sub-pixel W-SP upward to improve an out-coupling efficiency, and the first and second lenses 201 and 203 may have a convex shape.

Accordingly, the first and second lenses 201 and 203 may be formed in a semi-elliptical or semi-circular shape having a curved surface.

Here, a diameter s1 of the first lens 201 may be larger than a width w1 of the emission area EA of the white sub-pixel W-SP. Thus, the first lens 201 may be disposed over the entire emission area EA so that all of the light emitted from the light emitting area EA can be received into the first lens 201.

In other words, the first lens 201 may be arranged such that it has at least a larger size than the emission area EA of the white sub-pixel W-SP, covers all of the emission area EA and covers at least a portion of the non-emission area NEA.

Here, the width w1 of the emission area EA may mean the longest width in the light emitting area EA and the non-emission area NEA.

At this time, the first lens 201 may not invade the emission area EA of the adjacent white sub-pixel W-SP, and the first lenses 201 may be disposed to be spaced apart from each other.

In addition, a height h1 of the first lens 201 may be equal to or smaller than the diameter s1 of the first lens 201. Specifically, the height h1 of the first lens 201 may be 0.3 to 1 times the diameter s1 of the first lens 201.

Here, when the height h1 of the first lens 201 is 0.3 times or more of the diameter s1, a curved angle of the first lens 201 is increased to focus a light upward so that the out-coupling efficiency can be improved. In addition, when the height h1 of the first lens 201 is less than or equal to 1 time of the diameter s1, a process being difficult due to the height h1 of the first lens 201 becoming too large can be prevented.

In particular, when the height h1 and the diameter s1 of the first lens 201 have a ratio of 0.5:1, an effect due to the lens may be most effective.

In addition, the second lens 203 positioned corresponding to the non-emission area NEA of the white sub-pixel W-SP may be positioned in a spaced area between the first lenses 201 covering the emission areas EA of the adjacent white sub-pixels W-SP. Accordingly, in the neighboring white sub-pixels W-SP, the first and second lenses 201 and 203 may be alternately disposed to form peaks and valleys.

At this time, as the first lens 201 may be formed to be larger than the width w1 of the emission area EA of the white sub-pixel W-SP, the second lens 203 may be formed to be smaller than the width w2 of the non-emission area NEA of the white sub-pixel W-SP.

A height h2 of the second lens 203 may also be the same as or smaller than a diameter s2 of the second lens 203. Specifically, the height h2 of the second lens 203 may be 0.3 to 1 times the diameter s2, and alternatively the height h2 and the diameter s2 of the second lens 203 may be formed in a ratio of 0.5:1.

Accordingly, the second lens 203 may have the height h2 lower than that of the first lens 201.

The first and second lenses 201 and 203 may be formed by discharging a lens solution including a lens material to the back surface of the substrate 101 using an inkjet printing method or a nozzle printing method and drying the lens solution. The lens solution may include a photocurable or thermosetting solution.

The first and second lenses 201 and 203 of the lens layer 210 positioned outside the substrate 101 may have refractive indices approximate to that of the substrate 101. In other words, the substrate 101 and the lens layer 210 may be formed to have approximate refractive indices to match the refractive indices. As used herein, "approximate" refers to values that are equal to or close to each other, or within a threshold difference from one another. For example, a difference between the refraction index of each of the first and second lenses 201 and 203 and the refraction index of the substrate 101 may be 0.05 or lower.

In addition, in the organic light emitting display device 100 according to the first aspect of the present disclosure, the high refractive index layer 220 may be further formed on the lens layer 210 including the first and second lenses 201 and 203. The high refractive index layer 220 may have a refractive index greater than that of the lens layer 210, and the high refractive index layer 220 and the lens layer 210 may have a refractive index difference of about 0.1 or more.

For example, when the lens layer 210 has a refractive index of 1.5 or approximate to 1.5, the high refractive index layer 220 is formed to have a refractive index of 1.6 or more.

Accordingly, a light path is changed at the interface between the lens layer 210 and the high refractive index layer 220. A light emitted from the emission area EA of the white sub-pixel W-SP passes through the substrate 101 and is incident on the lens layer 210, and due to the difference in refractive index between the lens layer 210 and the high refractive index layer 220, the light is refracted at the interface between the lens layer 210 and the high refractive index layer 220, thereby changing the light path.

Accordingly, the organic light emitting display device 100 according to the first aspect of the present disclosure can refract the light trapped inside the substrate 101 to the outside of the substrate 101 to improve the out-coupling efficiency.

Referring to FIG. 4 in more detail, in the case that the glass substrate 101 having the refractive index n1 of 1.5 is adopted in the organic light emitting display device 100 employing the light emitting diode E, when a light exits from the glass substrate 101 to the outside, the light L1 incident at the critical angle or greater is totally reflected and is isolated inside the substrate 101.

Since an amount of the isolated light L1 reaches about 35% of the light emitted from the light emitting diode E, an amount of light output outside the glass substrate 101 among the light emitted from the light emitting diode E is only about 20% (i.e., the light extraction efficiency is only 20%).

At this time, when the incident angle of the light emitted from the emission area EA of the white sub-pixel W-SP is greater than the total reflection critical angle, the light is incident on an area corresponding to the non-emission area NEA of the white sub-pixel W-SP of the substrate 101.

Here, in the organic light emitting display device 100 according to the first aspect of the present disclosure, the light extraction layer 200 is further formed outside the substrate 101, and in this case, the second lens 203 of the light extraction layer 200 is positioned to correspond to the non-emission area NEA of the white sub-pixel W-SP.

Accordingly, the light L2 incident on the substrate 101 with an incident angle greater than the critical angle of total reflection from the emission area EA of the white sub-pixel W-SP passes through the lens layer 210, is incident on the lens layer 210 having an approximate refractive index, and is directed toward the second lens 203.

In other words, when the substrate 101 has a refractive index of 1.5, the second lens 203 of the lens layer 210 also has a refractive index of 1.5 or has an approximate refractive index. Accordingly, as for the critical angle caused by the refractive index difference, a tangent line at which the critical angle is formed is changed through the curved shape of the second lens 203.

Accordingly, the angle of the incident angle can be reduced and an internal total reflection is prevented from occurring, so that the light L2 passes through the second lens 203.

At this time, since the high refractive index layer 220 having a larger refractive index than that of the second lens 203 is positioned outside the second lens 203, the light L2 passing through the second lens 203 is incident from a low medium to a high medium, and is refracted and propagated at a larger angle with respect to the normal at the point where the light L2 is incident according to Snell's law.

The refracted light is directed toward the first lens 201 having the height h1 greater than that of the second lens 203, and is thus refracted upward by the spherical surface of the first lens 201 to be output outside the light extraction layer 200.

Accordingly, the light output outside the light extraction layer 200 is focused.

In summary, the light L1 trapped inside the substrate 101 through the high refractive layer 220 and the second lens 203 is refracted to the outside of the substrate 101 to improve the out-coupling efficiency.

Accordingly, the luminance and emission efficiency of the organic light emitting display device 100 may be improved.

In addition, since the light L2 is focused by changing the path of the light L2 through the first lens 201, a front efficiency of the organic light emitting display device 100 is also improved by the focused light L2.

As described above, in the organic light emitting display device 100 according to the first aspect of the present disclosure, the light extraction layer 200 is formed on the back surface of the substrate 101 in the transmission direction of the light L2 and includes the second lens 203 positioned to correspond to the non-emission area NEA of the white sub-pixel W-SP, and the first lens 201 positioned to correspond to the emission area EA of the white sub-pixel W-SP. Thus, the light L1 trapped inside the substrate 101 is refracted to the outside of the substrate 101 to improve the out-coupling efficiency, and thus the luminance and emission efficiency of the organic light emitting display device 100 are improved.

In addition, since the light L2 is focused by changing the path of the light L2 through the first lens 201, the front efficiency of the organic light emitting display device 100 is also improved by the focused light L2.

Figure 5:
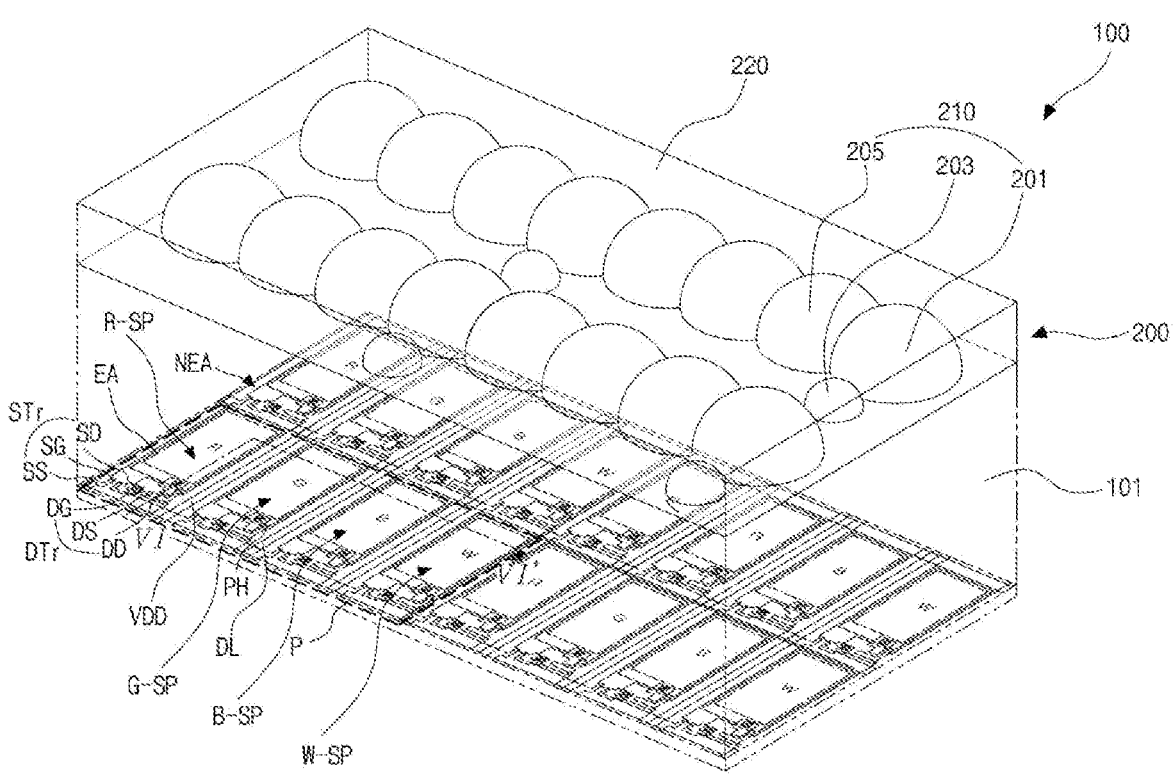
FIG. 5 is a perspective view schematically illustrating a back surface of an organic light emitting display device according to a second aspect of the present disclosure.
Figure 6:
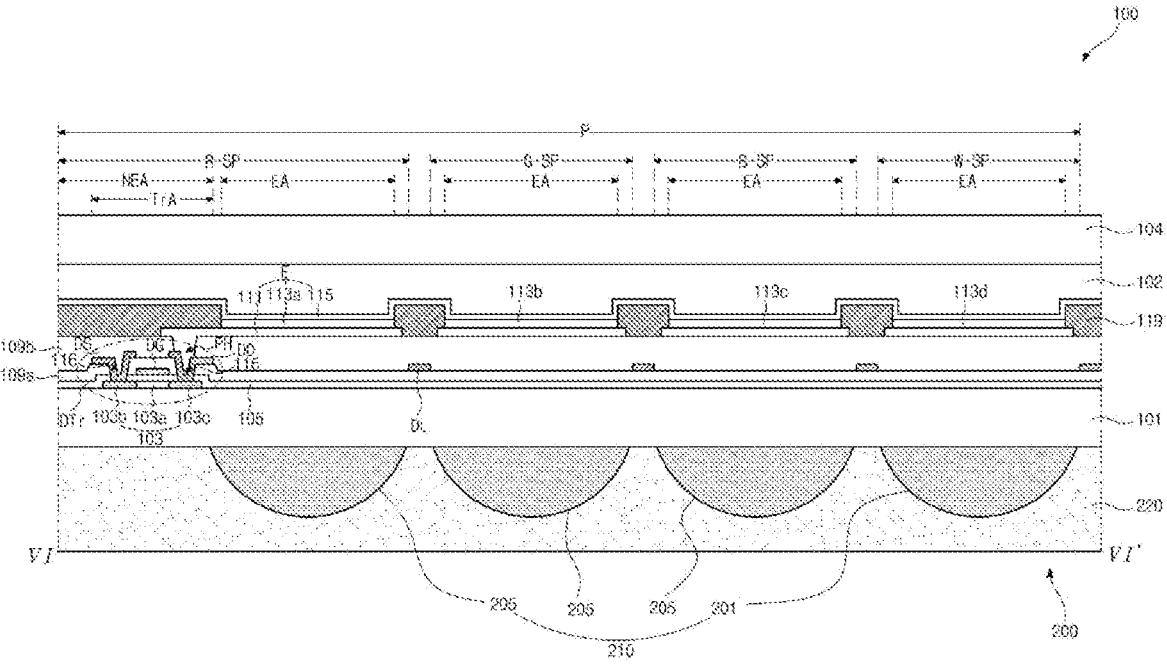
FIG. 6 is a cross-sectional view, taken along line VI-VI' of FIG. 5, illustrating a structure of a unit pixel including four sub-pixels of an organic light emitting display device according to a second aspect of the present disclosure.

FIG. 5 is a perspective view schematically illustrating a back surface of an organic light emitting display device according to a second aspect of the present disclosure. FIG. 6 is a cross-sectional view, taken along line VI-VI' of FIG. 5, illustrating a structure of a unit pixel including four sub-pixels of an organic light emitting display device according to the second aspect of the present disclosure.

Meanwhile, in order to avoid repeated explanations, the same reference numerals are given to the same parts serving the same roles as those of the above-described first aspect, and only the characteristic contents of the second aspect may be explained.

As shown in FIGS. 5 and 6, a driving thin film transistor DTr including a semiconductor layer 103, a gate insulating layer 105, a gate electrode DG, and source and drain electrodes DS and DD may be located on a switching region TrA of a non-emission region NEA on a substrate 101.

A first electrode 111 may be positioned on a second inter-layered insulating layer 109b and may be connected to the drain electrode DD exposed through a drain contact hole PH provided in the gate insulating layer 105 and a first inter-layered insulating layer 109a. Organic light emitting layers 113a, 113b, 113c and 113d may be positioned on the respective first electrodes 111. A second electrode 115 forming a cathode may be positioned entirely on the organic light emitting layers 113a, 113b, 113c and 113d. The first electrode 111, the organic light emitting layer 113a, 113b, 113c or 113d, and the second electrode 115 may form a light emitting diode E.

In this case, the first electrode 111 may be positioned for each of the sub-pixels W-SP, R-SP, G-SP and B-SP, and a bank 119 may be positioned between the first electrodes 111 for each of the sub-pixels W-SP, R-SP, G-SP and B-SP.

A passivation layer 102 in a form of a thin film and an encapsulation substrate 104 may be positioned on the driving thin film transistor DTr and the light emitting diode E, and the organic light emitting display device 100 may be encapsulated.

The organic light emitting display device 100 may be a bottom emission type display device, and a light emitted from the organic light emitting layers 113a, 113b, 113c and 113d passes through the first electrode 111 and exits to the outside, so that the organic light emitting display device 100 realizes an arbitrary image.

Here, the organic light emitting display device 100 according to the second aspect of the present disclosure is characterized in that it further includes a light extraction layer 200 outside the substrate 101 through which the light emitted from the organic light emitting layers 113a, 113b, 113c and 113d is finally transmitted.

The light extraction layer 200 may include a lens layer 210 and a high refractive index layer 220 covering the lens layer 210. The lens layer 210 may include a first lens 201 positioned to correspond to the emission area EA of the white sub-pixel W-SP, and a second lens 203 positioned to correspond to the non-emission area NEA of the white sub-pixel W-SP.

In addition, the lens layer 210 of the organic light emitting display device 100 according to the second aspect of the present disclosure may further include a third lens 205 positioned to correspond to the emission areas EA of the red, green and blue sub-pixels R-SP, G-SP and B-SP.

All of the first, second and third lenses 201, 203 and 205 may serve to refract lights emitted from the organic light emitting layers 113a, 113b, 113c and 113d of the respective sub-pixels R-SP, G-SP, B-SP and W-SP upward to improve an out-coupling efficiency, and may have a convex shape.

Accordingly, the first, second and third lenses 201, 203 and 205 may be formed in a semi-elliptical or semi-circular shape having a curved surface.

Here, a diameter s1 of each of the first and third lenses 201 and 205 may be larger than a width w1 of the emission area EA of each of the sub-pixels R-SP, G-SP, B-SP and W-SP. Thus, the first and third lenses 201 and 205 may be disposed entirely over the corresponding emission areas EA so that all of the lights emitted from the light emitting areas EA can be received into the first and third lenses 201 and 205.

Here, the width w1 of the emission area EA may mean the longest width in the light emitting area EA and the non-emission area NEA.

At this time, each of the first lens 201 and the third lens 205 may not invade the emission area EA of the adjacent sub-pixel R-SP, G-SP, B-SP or W-SP. The first lenses 201 may be disposed to be spaced apart from each other, and the third lenses 205 may be disposed to be spaced apart from each other.

In addition, a height h1 of each of the first and third lenses 201 and 205 may be equal to or smaller than the diameter s1 thereof. Specifically, the height h1 of each of the first and third lenses 201 and 205 may be 0.3 to 1 times the diameter s1 thereof.

In particular, when the height h1 and the diameter s1 of each of the first and third lenses 201 and 205 are in a ratio of 0.5:1, an effect due to the lens may be most effective.

In addition, the second lens 203 positioned corresponding to the non-emission area NEA of the white sub-pixel W-SP may be positioned in a spaced area between the first lenses 201 covering the emission areas EA of the adjacent white sub-pixels W-SP. Accordingly, in the neighboring white sub-pixels W-SP, the first and second lenses 201 and 203 may be alternately disposed to form peaks and valleys.

At this time, as the first lens 201 may be formed to be larger than the width w1 of the emission area EA of the white sub-pixel W-SP, the second lens 203 may be formed to be smaller than the width w2 of the non-emission area NEA of the white sub-pixel W-SP.

A height h2 of the second lens 203 may also be the same as or smaller than a diameter s2 of the second lens 203. Specifically, the height h2 of the second lens 203 may be 0.3 to 1 times the diameter s2, and alternatively, the height h2 and the diameter s2 of the second lens 203 may be formed in a ratio of 0.5:1.

Accordingly, the second lens 203 may have the height h2 lower than that of the first and third lenses 201 and 205.

The first, second and third lenses 201, 203 and 205 may be formed by discharging a lens solution including a lens material to the back surface of the substrate 101 using an inkjet printing method or a nozzle printing method and drying the lens solution. The lens solution may include a photocurable or thermosetting solution.

The first, second and third lenses 201, 203 and 205 of the lens layer 210 positioned outside the substrate 101 may have refractive indices approximate to that of the substrate 101. In other words, the substrate 101 and the lens layer 210 may be formed to have approximate refractive indices to match the refractive indices.

In addition, in the organic light emitting display device 100 according to the second aspect of the present disclosure, the high refractive index layer 220 may be further formed on the lens layer 210 including the first, second and third lenses 201, 203 and 205. The high refractive index layer 220 may have a refractive index greater than that of the lens layer 210, and the high refractive index layer 220 and the lens layer 210 may have a refractive index difference of about 0.1 or more.

For example, when the lens layer 210 has a refractive index of 1.5 or approximate to 1.5, the high refractive index layer 220 is formed to have a refractive index of 1.6 or more.

Accordingly, the light incident on the substrate 101 with an incident angle greater than the critical angle of total reflection from the emission area EA of the white sub-pixel W-SP passes through the lens layer 210, is incident on the lens layer 210 having an approximate refractive index, and is directed toward the second lens 203 because of an internal total reflection thereof being prevented.

At this time, since the high refractive index layer 220 having a larger refractive index than that of the second lens 203 is positioned outside the second lens 203, the light passing through the second lens 203 is incident from a low medium to a high medium, and is refracted and propagated at a larger angle with respect to the normal at the point where the light is incident according to Snell's law.

The refracted light is directed toward the first and third lenses 201 and 205 having the height h1 greater than that of the second lens 203, and is thus refracted upward by the spherical surface of the first and third lenses 201 and 205 to be output outside the light extraction layer 200.

Accordingly, the light output outside the light extraction layer 200 is focused.

Accordingly, in the organic light emitting display device 100 according to the second aspect of the present disclosure, the light trapped inside the substrate 101 is refracted to the outside of the substrate 101 to improve the out-coupling efficiency. In addition, since the light is focused by changing the light path through the first and third lenses 201 205, a front efficiency of the organic light emitting display device 100 is also improved by the focused light.

Meanwhile, although the organic light emitting display device 100 as a bottom emission type display device is described and illustrated above, regardless of the emission direction of the organic light emitting display device 100, the light extraction layer 200 may be formed outside the substrate 101 or encapsulation substrate 104 depending on the emission direction.

In other words, when the organic light emitting display device 100 is configured as the top emission type display device, the light extraction layer 200 is positioned outside the encapsulation substrate 104, and in this case, the lens layer 210 of the light extraction layer 200 may be formed to have a refractive index approximate to that of the encapsulation substrate 104 to match the refractive index of the encapsulation substrate 104. Alternatively, when the encapsulation substrate 104 is omitted and only the passivation layer 102 is formed, the light extraction layer 200 is formed outside the passivation layer 102, and the refractive index of the lens layer 210 of the light extraction layer 200 may match a refractive index of an outermost layer of the passivation layer 102.

As such, the organic light emitting display device 100 provided with the light extraction layer 200 can improve the out-coupling efficiency.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An organic light emitting display device, comprising:
   a substrate in which a pixel is defined, the pixel including
      a white sub-pixel which includes an emission area and
      a non-emission area;
   a first light emitting diode located in the white sub-pixel;
   a light extraction layer located on an outer surface of the
      substrate corresponding to a transmission direction of
      light emitted from the first light emitting diode; and red, green and blue sub-pixels alternately arranged in a horizontal direction of the white sub-pixel, the white, red, green and blue sub-pixels being arranged in a stripe shape, wherein the non-emission area corresponds to an area between two adjacent white sub-pixels, wherein the light extraction layer includes a first lens corresponding to the emission area and a second lens corresponding to the non-emission area, wherein the first lens has a height greater than a height of the second lens, and wherein the first lens and the second lens face each other in a lateral direction.

2. The organic light emitting display device of claim 1, wherein the light extraction layer includes a high refractive index layer covering the first and second lenses.

3. The organic light emitting display device of claim 2, wherein each of the first and second lenses has a first refractive index approximate to that of the substrate, and wherein the high refractive index layer has a second refractive index greater than the first refractive index.

4. The organic light emitting display device of claim 3, wherein a difference between the first refractive index and the second refractive index is 0.1 or greater.

5. The organic light emitting display device of claim 1, wherein the first lens has a first width greater than a width of the emission area, the second lens has a second width less than a width of the non-emission area, and the first width is greater than the second width.

6. The organic light emitting display device of claim 5, wherein the first and second lenses configured to be a convex shape having a curved surface and form a plurality of peaks and valleys.

7. The organic light emitting display device of claim 1, wherein each of the first and second lenses has a height to diameter ratio of 0.5:1.

8. The organic light emitting display device of claim 1, wherein the light extraction layer includes a third lens corresponding to the emission area of each of the red, green, and blue sub-pixels, and wherein a height of the third lens is greater than a height of the second lens.

9. The organic light emitting display device of claim 1, further comprising second, third and fourth light emitting diodes respectively located in the red, green and blue sub-pixels, wherein the first, second, third and fourth light emitting diodes respectively emit white, red, green and blue lights.

10. The organic light emitting display device of claim 1, further comprising second, third and fourth light emitting diodes respectively located in the red, green and blue sub-pixels, wherein each of the first, second, third and fourth light emitting diodes emits a white light.

11. The organic light emitting display device of claim 10, further comprising red, green and blue color filter patterns located between the light extraction layer and the second, third and fourth light emitting diodes and correspond to the emission areas of the red, green and blue sub-pixels, respectively.

12. The organic light emitting display device of claim 11, further comprising a white color filter pattern located between the light extraction layer and the first light emitting diode and correspond to the emission area of the white sub-pixel.

13. An organic light emitting display device, comprising:

a substrate in which a pixel is defined, the pixel including a white sub-pixel which includes an emission area and a non-emission area;

a first light emitting diode located in the white sub-pixel;

a light extraction layer located on an outer surface of the substrate corresponding to a transmission direction of light emitted from the first light emitting diode; and red, green and blue sub-pixels alternately arranged in a horizontal direction of the white sub-pixel, the white, red, green and blue sub-pixels being arranged in a stripe shape, wherein the non-emission area corresponds to an area between two adjacent white sub-pixels, wherein the light extraction layer includes a first lens corresponding to the emission area and a second lens corresponding to the non-emission area, wherein the first lens has a height greater than a height of the second lens, and wherein a convex direction of the first lens is equal to a convex direction of the second lens faces.

14. The organic light emitting display device of claim 13, wherein the light extraction layer includes a third lens corresponding to the emission area of each of the red, green, and blue sub-pixels, and wherein a height of the third lens is greater than a height of the second lens.

15. The organic light emitting display device of claim 13, further comprising second, third and fourth light emitting diodes respectively located in the red, green and blue sub-pixels, wherein the first, second, third and fourth light emitting diodes respectively emit white, red, green and blue lights.

16. The organic light emitting display device of claim 13, further comprising second, third and fourth light emitting diodes respectively located in the red, green and blue sub-pixels, wherein each of the first, second, third and fourth light emitting diodes emits a white light.

17. The organic light emitting display device of claim 16, further comprising red, green and blue color filter patterns located between the light extraction layer and the second, third and fourth light emitting diodes and correspond to the emission areas of the red, green and blue sub-pixels, respectively.

18. The organic light emitting display device of claim 17, further comprising a white color filter pattern located between the light extraction layer and the first light emitting diode and correspond to the emission area of the white sub-pixel.

* * * * *